United States Patent [19]

Sakumoto et al.

[11] Patent Number: 4,933,219

[45] Date of Patent: Jun. 12, 1990

[54] ADHESIVE TAPES FOR DIE BONDING

[75] Inventors: Yukinori Sakumoto; Atsushi Koshimura; Hiroshi Matsushita; Masaki Tsushima, all of Shizuoka, Japan

[73] Assignee: Tomoegawa Paper Co., Ltd., Tokyo, Japan

[21] Appl. No.: 325,090

[22] Filed: Mar. 20, 1989

Related U.S. Application Data

[63] Continuation of Ser. No. 91,965, Sep. 1, 1987, abandoned.

[30] Foreign Application Priority Data

Jul. 15, 1987 [JP] Japan .................................. 62-174826

[51] Int. Cl.$^5$ ............................ B32B 7/06; B32B 7/12
[52] U.S. Cl. ..................................... 428/40; 428/355; 428/906; 525/438; 252/511
[58] Field of Search .................. 428/40, 343, 355, 906; 252/511; 525/438

[56] References Cited

U.S. PATENT DOCUMENTS

| 2,599,359 | 6/1952 | Banks et al. | 428/40 X |
| 3,741,786 | 6/1973 | Torrey | 428/906 |
| 4,410,457 | 10/1983 | Fujimura et al. | 252/511 X |
| 4,574,056 | 3/1986 | Kimura | 252/511 X |
| 4,695,508 | 9/1987 | Kageyama et al. | 252/511 X |
| 4,696,764 | 9/1987 | Yamazaki | 524/401 X |

Primary Examiner—Alexander S. Thomas
Attorney, Agent, or Firm—Cushman, Darby & Cushman

[57] ABSTRACT

An adhesive tape for die bonding is disclosed, comprising a continuous tape wound on a reel, the continuous tape having a structure that an adhesive layer composed mainly of a filler and a binder comprised of an epoxy resin and a polyester resin is laminated on a release film. According to the adhesive tape for die bonding of the invention, bonding of semiconductor elements can be attained with good workability and high reliability by very easily handling of the adhesive tape.

2 Claims, 2 Drawing Sheets

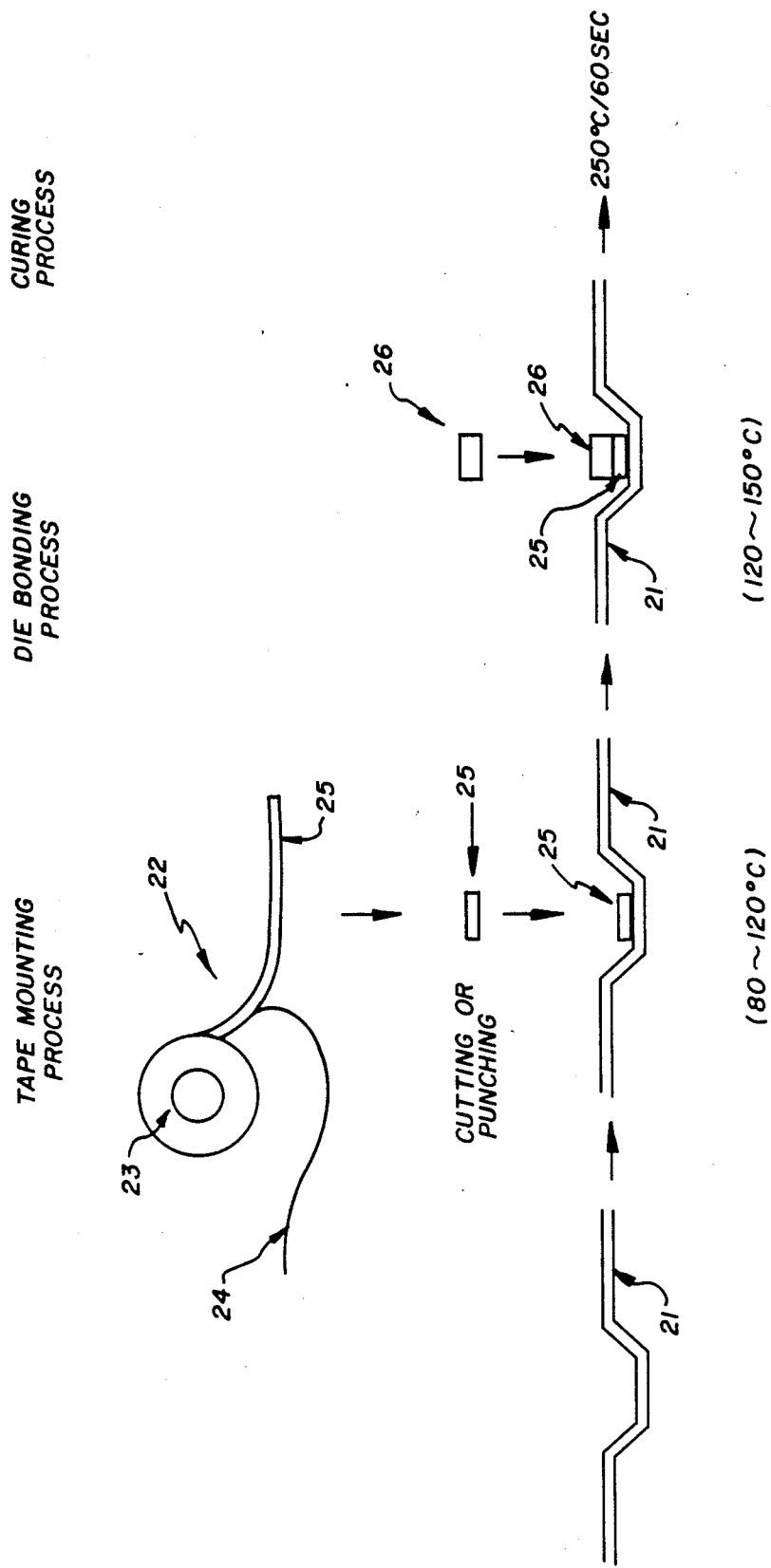

ADHESIVE TAPES FOR DIE BONDING

This is a continuation of Application No. 07/091,965, filed Sept. 1, 1987 now abandoned, which was abandoned upon the filing hereof.

FIELD OF THE INVENTION

This invention relates to an adhesive tape for die bonding, which is used for attaching a semiconductor element to a substrate or a lead frame.

BACKGROUND OF THE INVENTION

In the field of semiconductor devices such as transistor, etc., various bonding methods have been developed for incorporating semiconductor chips in packages and practically used.

In these methods, a technique called as die bonding is for attaching a semiconductor chip to a definite position of a substrate for the purposes of ensuring the mechanical protection, electrical connection, heat dissipation, etc. of chips to packages, and is practically performed by the following manners.

(a) Eutectic crystal alloy method: A connection method of scrubbing an Au surface as a conductor surface to which an Si chip is attached with respect to the back surface of the Si chip while heating to about 400° C. to thereby effect alloying by an Au-Si eutectic crystal. However, this method is very expensive due to the use of gold.

(b) Resin bonding method: A method of bonding a chip subjected to a back surface treatment with a thermosetting resin such as an epoxy resin, etc. by a pasty adhesive containing a filler such as Ag, Au, $SiO_2$, MgO, etc. However, in this method, it required a long period of time for curing the resin although the mounting work can be performed at ambient temperature. Also, this method has a disadvantage that the pasty adhesive is inferior in workability because a definite amount thereof must be calculated and also the adhesive gives tacky circumstances. Furthermore, such a pasty adhesive has a trouble that a silver powder is separated by causing sedimentation during the storage of the paste.

The present invention has been made for solving the aforesaid problems in the conventional techniques.

SUMMARY OF THE INVENTION

An object of this invention is to provide an adhesive tape for die bonding comprising a continuous tape wound on a reel, the continuous tape having a structure that an adhesive layer composed mainly of a filler and a binder comprised of an epoxy resin and a polyester resin is laminated on a release film.

In this invention, when the binder used in the adhesive layer is comprised of an epoxy resin and a polyester resin, the resulting adhesive tape is excellent in not only heat resistance and adhesive strength but also flexibility, does not generate decomposed gases which likely reduce the performance as a semiconductor device, and also is excellent in reliability.

BRIEF DESCRIPTION OF THE DRAWINGS

FIG. 3 is a schematic view showing a bonding step using the adhesive tape of this invention.

DETAILED DESCRIPTION OF THE INVENTION

Figure 1:
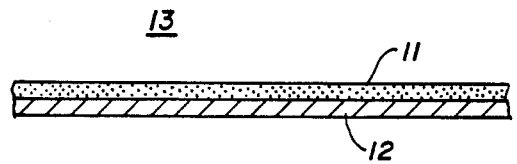
FIG. 1 is an enlarged sectional view of an example of the structure of the adhesive tape of this invention.
Figure 2:
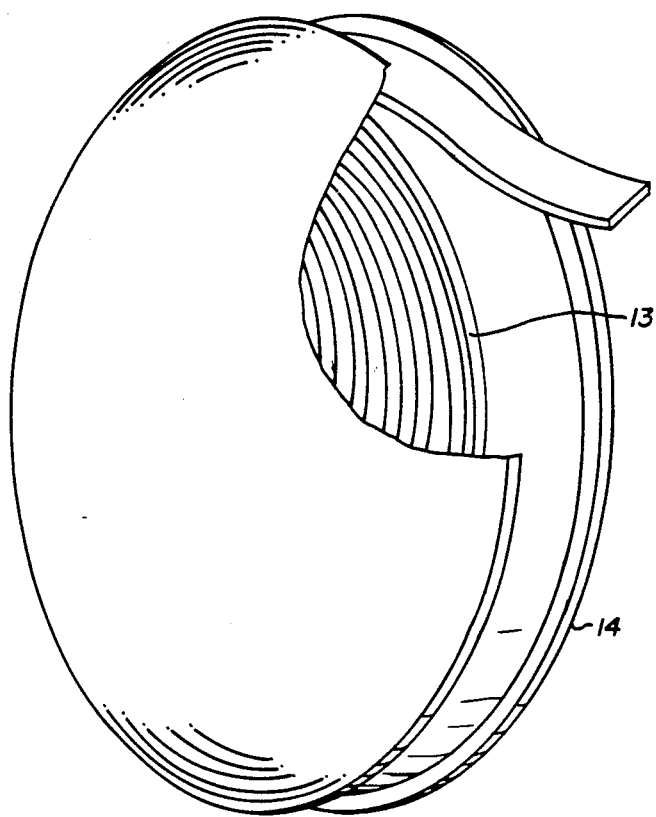
FIG. 2 is a perspective view of an example of the adhesive tape of this invention.

In the adhesive tape according to this invention, as shown in FIG. 1, continuous tape 13 is composed of adhesive layer 11 mainly comprising a binder composed of a thermosetting resin and a filler and release film 12 and, as shown in FIG. 2, the continuous tape 13 is wound on reel 14.

Examples of the resins which are used for the binder in this invention are described in detail.

Epoxy Resin (1) Bisphenol A type epoxy resin

The resin is a most general epoxy resin having the formula shown below, produced by condensation reaction of 4,4'-dioxyphenylpropane (bisphenol A) and epichlorohydrin. In this case, when the mole number of epichlorohydrin is reduced, those epoxy resins having an —OH group are obtained.

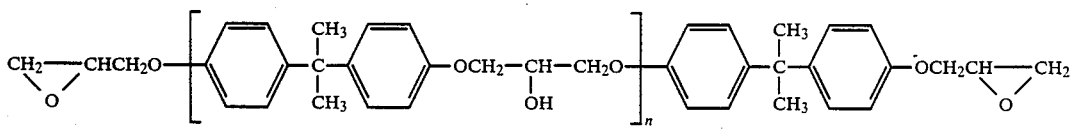

This type of epoxy resin is known as Epikote ® 1001 made by Yuka Shell Epoxy Co., Ltd. Epotohto ® YD-014 made by Tohto Kasei Co., Ltd., etc. and has a high adhesive strength but is slightly inferior in heat resistance.

(2) Novolak type epoxy resin

The resin is an epoxy resin formed by reaction of an phenolic hydroxyl group and epichlorohydrin and includes the following resins.

Phenol novolak glycidyl ether
o-Cresol novolak glycidyl ether
m-Cresol novolak glycidyl ether The chemical structure of o-cresol novolak glycidyl ether is as follows.

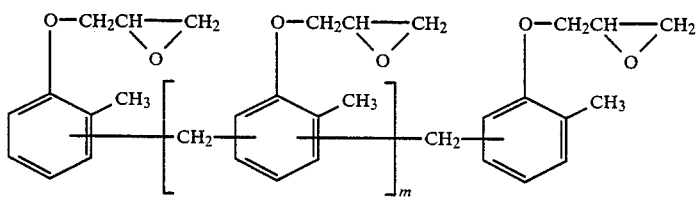

These novolak type epoxy resins have higher heat resistance (higher crosslinked density) than those of the aforesaid bisphenol A type epoxy resins but are slightly inferior in adhesion.

Accordingly, a mixed system of a novolak type epoxy resin and a bisphenol A type epoxy resin is most preferred.

However, the epoxy resin in this invention is not, as a matter of course, limited to the above-described epoxy resins.

Polyester Resin

In this invention, a polyester resin is compounded with the epoxy resin because a single usage of an epoxy resin cannot achieve the formation of a tape due to lacking in flexibility, but the compounding of a polyester therewith makes it possible to achieve the formation of a type.

As a material which renders the epoxy resin flexible for enabling it to form a tape, there could be mentioned acrylic resins, nylon-based resins, urethane-based resins, rubber-based resins, etc. in addition to polyester resins.

However, since these resins other than polyester resins are too high in melt viscosity, they are poor in wettability with an IC chip surface and a lead frame, which is required for bonding at loading the IC chip and, hence, it is impossible to achieve the die bonding in a stable manner.

On the other hand, the polyester resin does not give such problems as described above and is therefore suitably used.

As the polyester resin which can be used in this invention, any types of polyester resins such as saturated or unsaturated polyester resins, aliphatic or aromatic polyester resins, and linear or branched chain polyester resins can be used.

A most preferred polyester resin in this invention is one having a glass transition temperature (Tg) by DSC of 30° C. or lower. For example, Vylon ® 300 (a linear saturated aliphatic polyester resin made by Toyobo Co., Ltd.) having a molecular weight of from 200,000 to 250,000 is preferably used in this invention because the glass transition point (Tg) is 6° C., the melt viscosity is low, and the adhesion is kept for a long period of time.

However, if the compounding amount of the polyester resin for the epoxy resin is too large, the tack becomes large, and troubles are liable to occur at a step of loading a semiconductor chip on the adhesive tape. Further, the heat resistance of the adhesive tape is lowered, and the adhesive tape is inferior in hydrolysis resistance, which results in lowering the reliability as semiconductor devices. Accordingly, it is preferred that the amount of the polyester resin is from 20 to 100 parts by weight based on 100 parts by weight of the epoxy resin in this invention.

A process of bonding a semiconductor element using the adhesive tape of this invention is explained by referring to FIG. 3.

Adhesive tape 22 is unwound from reel 23, adhesive portion 25 (formed into a tape) thereof is exposed by peeling off release film 24, the adhesive portion 25 is cut or punched into a definite length, and the cut or punched portion is brought into intimate contact with a central portion of lead frame 21 at temperature of from 80° C. to 120° C.

Then, IC chip 26 is placed on the adhesive portion 25, and the assembly is heated at from 120° to 150° C. for bonding, followed by keeping it.

Thereafter, the adhesive is cured for 60 seconds at 250° C., whereby a semiconductor element can be easily attached onto the lead frame 21.

The invention is further explained by the following examples.

EXAMPLE 1

| | |
|---|---|
| o-Cresol Novolak Type Epoxy Resin (Epotohto ® TDN-180, made by Tohto Kasei Co., Ltd.) | 10 weight parts |
| Bisphenol A Type Epoxy Resin (Epotohto ® YD-014, by Tohto Kasei Co., Ltd.) | 5 weight parts |
| Linear Saturated Aliphatic Polyester Resin (Vylon ® 300, made by Toyobo Co., Ltd.) | 5 weight parts |
| Silver Powder | 50 weight parts |
| 2-Phenyl-4-methylimidazole (2P4MZ, made by Shikoku Fine Chemical Co., Ltd.) | 0.5 weight parts |
| Methyl Ethyl Ketone | 30 weight parts |

A mixture of the aforesaid components was kneaded in a mixer, coated on a 38 μm-thick silicone-treated polyethylene terephthalate film by using a reverse roll coater, followed by drying to form an adhesive layer having a thickness of 20 μm in an uncured or semi-cured state, and an adhesive tape thus obtained was wound on an acrylic resin-made reel to provide an adhesive tape for die bonding of this invention.

EXAMPLE 2

| | |
|---|---|
| Phenol Novolak Type Epoxy Resin (Epotohto ® YDCN-704, made by Tohto Kasei Co., Ltd.) | 10 weight parts |
| Bisphenol A Type Epoxy Resin (Epotohto ® YD-014, by Tohto Kasei Co., Ltd.) | 5 weight parts |
| Linear Saturated Aliphatic Polyester Resin (Vylon ® 300, made by Toyobo Co., Ltd.) | 5 weight parts |
| Silver Powder | 50 weight parts |
| 2-Heptadecylimidazole ($C_{17}Z$, made by Shikoku Fine Chemical Co., Ltd.) | 0.5 weight parts |
| Methyl Ethyl Ketone | 30 weight parts |

A mixture of the aforesaid components was kneaded in a mixer and coated on a 50 μm-thick fluorocarbon resin film using a reverse roll coater, followed by drying to form an adhesive layer having a thickness of 20 μm. An adhesive tape thus obtained was wound on a polycarbonate-made reel to provide an adhesive tape for die bonding of this invention.

EXAMPLE 3

By following the same procedures as in Example 2 except that 50 parts by weight of $Al_2O_3$ was used in place of 50 parts by weight of the silver powder, an adhesive tape for die bonding of this invention was obtained.

Each of the adhesive tapes for die bonding obtained in Examples 1, 2, and 3 could be loaded by an IC chip loading means described above and make tape mounting with high reliability.

EXAMPLE 4

By following the same procedures as in Example 1 except that 5 parts by weight of a linear saturated aromatic saturated polyester resin (Vylon® 590, made by Toyobo Co., Ltd., Tg: 15° C.) was used in place of 5 parts by weight of the linear saturated aliphatic saturated polyester resin (Vylon® 300), an adhesive tape for die bonding of this invention was obtained.

COMPARATIVE EXAMPLE

A comparative adhesive tape was tried to make by the same manner as in Example 1 except that the adhesive layer was formed using the adhesive composition in Example 1 without using, however, the linear saturated aliphatic polyester resin, but the adhesive composition could not form a tape state due to lacking in flexibility.

In addition, the adhesive tape having a release film at one side thereof may have the release film on either one desired side because the release film has a function of preventing the adhesive layer from sticking to each other at winding, but it is advantageous for preventing the occurrence of staining in the inside of the wound adhesive tape to dispose the release film at the outer side of the adhesive layer. Also, as a matter of course, release films may be stuck to both the sides of the adhesive tape.

As described above, according to this invention, bonding of semiconductor elements can be attained with good workability and high reliability by very easy handling of the adhesive tape.

While the invention has been described in detail and with reference to specific embodiments thereof, it will be apparent to one skilled in the art that various changes and modifications can be made therein without departing from the spirit and scope thereof.

What is claimed is:

1. An adhesive tape for die bonding which comprises an adhesive layer laminated on a surface of a release film,
   wherein said adhesive layer is composed mainly of a filler by weight and a binder comprising:
   (a) a mixture of a novolak resin and a bisphenol A epoxy resin and
   (b) a polyester resin with a glass transition temperature of 30° or lower, Sakumoto et al., Serial No. 07/325,090
   wherein said adhesive tape is a continuous tape wound on a reel.

2. An adhesive tape according to claim 1, wherein the proportion of said polyester resin in said binder is from 20 to 100 parts by weight, based on 100 parts by weight of said epoxy resin.

* * * * *